(12) United States Patent
Magel et al.

(10) Patent No.: US 11,169,029 B2
(45) Date of Patent: Nov. 9, 2021

(54) COAXIAL FIBER OPTICAL PYROMETER WITH LASER SAMPLE HEATER

(71) Applicant: Waviks, Inc., Dallas, TX (US)

(72) Inventors: Gregory A. Magel, Dallas, TX (US); Thomas M. Moore, Dallas, TX (US)

(73) Assignee: Waviks, Inc., Dallas, TX (US)

( * ) Notice: Subject to any disclaimer, the term of this patent is extended or adjusted under 35 U.S.C. 154(b) by 109 days.

(21) Appl. No.: 16/550,680

(22) Filed: Aug. 26, 2019

(65) Prior Publication Data

US 2020/0064199 A1 Feb. 27, 2020

Related U.S. Application Data

(60) Provisional application No. 62/723,114, filed on Aug. 27, 2018.

(51) Int. Cl.
| | | |
|---|---|---|
| *G01J 5/02* | (2006.01) | |
| *G01J 5/10* | (2006.01) | |
| *G01J 5/08* | (2006.01) | |
| *H01J 37/22* | (2006.01) | |
| *G02B 6/036* | (2006.01) | |

(Continued)

(52) U.S. Cl.
CPC ............. *G01J 5/025* (2013.01); *G01J 5/0806* (2013.01); *G01J 5/0815* (2013.01); *G01J 5/0821* (2013.01); *G01J 5/0896* (2013.01); *G01J 5/10* (2013.01); *G02B 6/036* (2013.01);
(Continued)

(58) Field of Classification Search
CPC ........ G01J 5/025; G01J 5/0806; G01J 5/0815; G01J 5/0821; G01J 5/0896; G01J 5/10; G02B 6/036; G02B 6/4246; H01J 37/226; H01J 37/26
See application file for complete search history.

(56) References Cited

U.S. PATENT DOCUMENTS

| | | |
|---|---|---|
| 5,156,461 A | 10/1992 | Moslehi et al. |
| 5,317,656 A | 5/1994 | Moslehi et al. |

(Continued)

OTHER PUBLICATIONS

Wu et al., Scanning all-fiber-optic endomicroscopy system for 3D nonlinear optical imaging of biological tissues, Optics Express, vol. 17, No. 10, May 11, 2009, pp. 7907-7915.

(Continued)

*Primary Examiner* — David P Porta
*Assistant Examiner* — Jeremy S Valentiner
(74) *Attorney, Agent, or Firm* — John A. Thomas

(57) ABSTRACT

An optical pyrometer having a coaxial light guide delivers laser radiation through optics to heat a localized area on a sample, and simultaneously collects optical radiation from the sample to perform temperature measurement of the heated area. Inner and outer light guides can comprise the core and inner cladding, respectively, of a double-clad fiber (DCF), or can be formed using a combination of optical fibers in one or more coaxial bundles. Coaxial construction and shared optics facilitate alignment of the centers of the heated and observed areas on the sample. The heated area can be on the order of micrometers when using a single-mode optical fiber core as the inner light guide. The system can be configured to heat small samples within a vacuum system of charged-particle beam microscopes such as electron microscopes. A method for using the invention in a microscope is also provided.

10 Claims, 8 Drawing Sheets

(51) Int. Cl.
*G02B 6/42* (2006.01)
*H01J 37/26* (2006.01)

(52) U.S. Cl.
CPC .......... *G02B 6/4246* (2013.01); *H01J 37/226* (2013.01); *H01J 37/26* (2013.01); *H01J 2237/24585* (2013.01)

(56) References Cited

U.S. PATENT DOCUMENTS

| | | | | |
|---|---|---|---|---|
| 5,324,932 | A * | 6/1994 | Niewisch | A61B 5/055 250/227.21 |
| 7,447,408 | B2 | 11/2008 | Bouma et al. | |
| 2006/0013544 | A1 * | 1/2006 | Bouma | G02B 6/02 385/116 |
| 2012/0236303 | A1 * | 9/2012 | Marple | G01J 3/0218 356/301 |
| 2019/0296513 | A1 * | 9/2019 | Takigawa | H01S 3/04 |

OTHER PUBLICATIONS

Mavadia et al., An all-fiber-optic endoscopy platform for simultaneous OCT and fluorescence imaging, Biomedical Optics Express, vol. 3, No. 11, Nov. 1, 2012, pp. 2851-2859.

Picher et al., Vibrational and optical spectroscopies integrated with environmental transmission electron microscopy, Ultramicroscopy, vol. 150, 2015, pp. 10-15. Available online Dec. 2, 2014.

Allen et al., In situ TEM Raman spectroscopy and laser-based materials modification, Ultramicroscopy, vol. 178, 2017, pp. 33-37. Available online Jul. 7, 2016.

Fernando et al., Optical and Optoelectronic Property Analysis of Nanomaterials inside Transmission Electron Microscope, Small, vol. 13, 2017, 1701564.

Tuschel, David, Raman Thermometry, Spectroscopy, Dec. 2016, pp. 8-13.

* cited by examiner

COAXIAL FIBER OPTICAL PYROMETER WITH LASER SAMPLE HEATER

CLAIM FOR PRIORITY

This application claims the benefit under 35 U.S.C. 119(e) of U.S. Provisional Application No. 62/723,114, filed Aug. 27, 2018.

This invention was made with government support under Award Number 1746019, awarded by the National Science Foundation. The government has certain rights in the invention.

BACKGROUND

Technical Field

This invention is directed to the field of optical pyrometry, and more specifically to a system and method for an optical pyrometer and laser sample heater for use in microscopy.

Background

Optical delivery systems such as the Vesta™ system from Waviks, Inc. have been recently demonstrated for in situ heating and excitation in charged-particle beam microscopes such as the transmission electron microscope (TEM), focused ion beam and scanning electron microscopes (FIB-SEM) and helium ion microscopes (HIM) These systems permit the introduction of laser or other light, typically through an optical fiber, into the vacuum system of the charged-particle beam microscope and the focusing of the laser light onto a sample. Alignment of a focused laser spot with an electron beam in a TEM allows observation of a sample during irradiation by the laser using the TEM. Using the optical delivery system for heating takes advantage of the high optical power densities available in the focused spot to enable rapid and localized heating of samples, to high temperatures in times on the microsecond scale, with various advantages compared to sample heaters that rely on electrical heating of a sample holder.

Localized heating permits experiments on multiple areas of a large sample without removing the sample holder; in the case of small isolated samples, multiple experiments on different isolated samples are likewise possible without affecting neighboring samples by focusing the heating beam. Confining the heated area to a very small one (perhaps only a few micrometers across) also minimizes sample movement and bulging due to thermal expansion, which can blur or otherwise adversely affect the quality of images or data taken in the TEM. It helps that the sample can be heated directly using focused laser energy without also heating the surrounding sample holder, which can also experience deformation or movement due to thermal expansion if heated.

Using optical irradiation for heating or excitation is inherently non-contact, and this is another advantage compared to resistive heating of a sample holder. There is no risk of contamination of the sample due to contact with the material of a heater. No special sample holder with electrical connections is needed. However, this also means that electrical connections may be unavailable to communicate with temperature sensors placed at the sample. (Even if it were possible to place small temperature sensors localized on small samples, the number of such sensors would be limited by wires or other communication means, and some of the advantages of local heating might be lost.)

Optical pyrometry using a variety of physical effects can be used for non-contact measurement of the temperature of a surface, and a number of optical fiber-based systems, most based on the measurement of long-wavelength black-body radiation, have been developed for temperature measurement.

Double-clad fiber (DCF) was originally developed for fiber amplifiers and fiber lasers. In DCF a central core is doped with an active species to guide and amplify an optical signal, and an inner cladding, coaxial and concentric with the central core, is used to guide multimode pump light used for exciting the active species in the core. In more recent years, other applications of DCF have been developed, related to a variety of fiber optical microscope imaging techniques. These fiber microscopes take advantage of simple optics enabled by the coaxial automatically-aligned geometry of the multimode inner cladding to efficiently collect scattered or fluorescent light from a sample stimulated by focused light delivered from the core.

None of these prior systems provide the combination of laser heating with temperature measurement of a concentric area on a sample. In order to maintain the advantage of non-contact and localized heating afforded by laser delivery, there thus remains a need for a system and method of non-contact temperature measurement reliably localized to a small area heated by a laser.

DRAWINGS

Non-limiting embodiments of the present disclosure are described by way of example in the following drawings, which are schematic and are not intended to be drawn to scale:

SUMMARY

Figure 1:
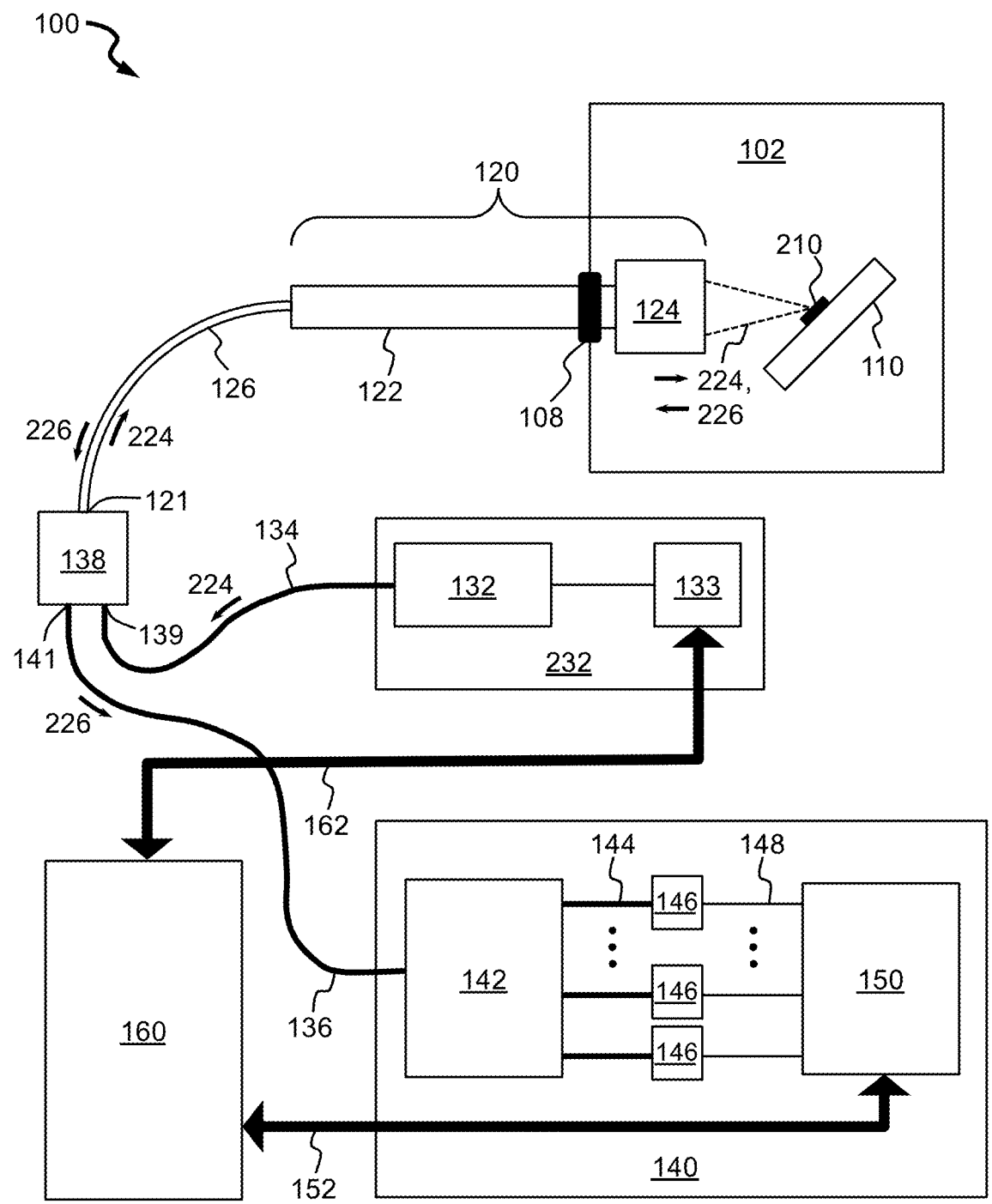
FIG. 1 is a schematic block diagram of an embodiment of a system for simultaneously irradiating and gathering light from a sample in a microscope.

This summary is not intended to identify key or critical elements of the invention, or to delimit the scope of the invention. Its sole purpose is to present some concepts of the invention in a simplified form as a prelude to the more detailed description that is presented later in this disclosure.

We disclose a pyrometer for use in a charged-particle beam microscope and methods for using the same. Generally, the pyrometer includes a bidirectional light guide having a proximal end and a distal end, and the bidirectional light guide further comprises an inner light guide and an outer light guide, with the outer light guide surrounding the inner light guide and coaxial therewith. The pyrometer has a directional coupler which has a laser port, an analyzer port, and a distal port. The distal port is optically coupled to the proximal end of the bidirectional light guide. The directional coupler is configured to direct a backward-propagating light emitted from a sample and entering the distal port to exit at the analyzer port, and to direct a forward-propagating light entering the laser port to exit at the distal port. A laser is optically coupled to the laser port of the directional coupler to provide forward-propagating laser light.

Focusing optics are optically coupled to the distal end of the light guide and configured to focus the forward-propagating laser light onto the sample. Collection optics are optically coupled to the distal end of the light guide and configured to collect backward-propagating light emitted from the sample. An optical analyzer is coupled to the analyzer port of the directional coupler. The optical analyzer is configured to measure at least one parameter of the backward-propagating light, and further comprises a processor configured to calculate a temperature of the sample from at least one measured parameter of the backward-propagating light. In this way, the sample is heated by the forward-propagating laser light focused onto it by the focusing optics, and the temperature of the sample is calculated from the measured parameter of the backward-propagating light.

DETAILED DESCRIPTION

This disclosure describes a system and method for simultaneously optically irradiating and gathering optical emissions from a sample, which may take place within a microscope, for example a vacuum chamber within a charged particle-beam microscope. The optical irradiation may be for the purpose of heating of the surface of a sample under observation, and the gathered optical emissions may be used for measuring the temperature of the sample during irradiation or at approximately the same time. Optical techniques to be described herein enable the use of the same optics to simultaneously irradiate and collect light in spatially coincident and roughly concentric areas on the sample. The collected light may be used for non-contact temperature measurement (thermometry) of the irradiated sample area using pyrometry or other optical techniques, or for other alternative purposes as will be described later. (In this application, "or" means the inclusive or unless otherwise stated.)

FIG. 1 shows a schematic block diagram of a system 100 for simultaneously irradiating and gathering light from a sample in a microscope. In some embodiments, the system 100 comprises a microscope 102 having electron optics, or light optics (not shown) for observing a sample 210 during irradiation. The sample 210 is mounted on a stage 110 that allows positioning of the sample within the microscope. The microscope may be an electron microscope or a light microscope, and may have a controlled-atmosphere or vacuum chamber (not shown explicitly, but implied in FIG. 1 by the square enclosure labeled 102) associated with it, within which the sample 210 may be placed.

An optical probe 120 allows direction of optical signals toward and away from a defined area of the sample 210 by using focusing optics 124 to concentrate forward-propagating light 224 going toward the sample at a small spot, and to collect backward-propagating light 226 coming from a substantially concentric area of the surface of the sample 210. (In this application, "forward" or "forward-propagating" refers to light passing toward a sample, and "backward" or "backward-propagating" refers to light passing from and away from the sample.)

The dashed lines in FIG. 1 labeled "224, 226" schematically represent the outer edges of a cone of light (generally not visible when passing through air or vacuum) converging (for forward light 224) upon, and diverging (for backward light 226) from, a small area of the sample 210. As part of probe 120, optics 124 may be mounted on the distal end of a tubular shaft 122 to make a conveniently positioned probe assembly 120. (In FIG. 1, "distal" refers to the direction toward the sample 210 and away from the light source 232, and "proximal" refers to the direction away from the sample 210 and toward the light source 232.) Furthermore, the optical probe 120 may be mounted and optionally sealed, for example to a controlled-atmosphere or vacuum chamber in microscope 102 using an optional mechanical or vacuum-sealed feed-through 108. The optical probe 120 preferably incorporates an alignment structure or mechanism (not shown) for positioning the distal end of a coaxial bidirectional light guide 126 (represented schematically as an optical cable) in precise relative position to the optics 124 to maintain alignment so that the forward and backward optical beams 224 and 226 form an optical connection between the distal end of bidirectional light guide 126 and sample 210.

The bidirectional light guide 126 allows bidirectional transmission of optical signals, as indicated by forward and backward optical paths 224 and 226, respectively. As will be described in more detail later, the light guide 126 has a coaxial structure, comprising an inner light guide 137 and an outer light guide 135 surrounding the inner light guide and coaxial therewith, transmitting light in opposite directions. Light guide 126 may comprise, for example, a type of double-clad optical fiber (DCF) containing coaxial single-mode and multimode cores and claddings. In a light guide 126 comprising DCF, a central core may be used in some embodiments for the forward path 224, and a surrounding inner cladding may be used for the backward path 226. Alternatively, the light guide 126 may comprise multiple optical fibers or bundles of fibers, as will also be described later.

A directional coupler 138 is provided in order to merge (or separate) light in the forward and backward paths 224 and 226 in light guide 126 into (or from) separate optical fibers 134 and 136, which carry forward light 224 and backward light 226 respectively. The directional coupler 138 has optical fiber inputs and outputs, and may be made, for example, using an all-fiber construction such as fused biconical taper technology (such all-fiber couplers for DCF are commercially available from Castor Optics Inc., through Thorlabs, Inc.). Alternatively, the directional coupler 138 may use bulk optics in the form of lenses and beam splitters to establish the optical connections within it.

The inputs and outputs of directional coupler 138 are referred to as "ports" between which the directional coupler 138 directs the various optical signals entering and leaving it. Specifically, directional coupler 138 has at least three ports for this application: a laser port 139, an analyzer port 141, and a distal port 121. Forward-propagating light 224 entering laser port 139 is directed to exit at distal port 121

(with very little forward-propagating light 224 exiting at analyzer port 141). Backward-propagating light 226 entering distal port 121 is directed to exit at analyzer port 141. Distal port 121 is connected to light guide 126 such that it is capable of coupling forward-propagating light 224 out of directional coupler 138 into light guide 126, and simultaneously coupling backward-propagating light 226 from light guide 126 into directional coupler 138.

Forward-propagating light 224 (toward the sample 210) may be provided by a light source 232, which may be a laser system, or by another fiber-coupled light source such as a broadband light source. For a sample heating application, in which high optical power densities are required for efficient heating of small areas on the sample, a laser source may be preferred. Lasers in a variety of wavelengths are available to interact efficiently with the particular optical absorption of sample 210. For heating the smallest possible area, a single-mode (single-transverse mode) fiber for the laser wavelength may be used for laser fiber 134, and a single-mode central core may be used in light guide 126. (A fiber is single-mode when it is a dielectric waveguide having a cutoff wavelength for its second transverse mode at a shorter wavelength than the laser wavelength to be guided.) Laser fiber 134 is connected to directional coupler 138 at laser port 139.

The laser system 232 may include a laser head 132 incorporating a fiber coupling to the laser fiber 134, and a power supply and controller 160 to energize laser head 132 to a selected power level, and to optionally pulse the laser optical output at predetermined pulse lengths and power levels. Laser system 232 is controlled through a laser interface 162, which may take the form of electronic signaling and cables connecting the laser power supply and controller 133 to a system controller 160.

The system controller 160 may be a general-purpose computer, or specialized hardware for controlling the laser system 232 and optical analyzer 140. Controller 160 may contain displays, input/output devices and interfaces, storage, and networking hardware, as well as software or firmware tailored to operate the system 100.

Light in the backward path 226, i.e., light coming from the sample 210, is directed by the directional coupler 138 through analyzer port 141 into the analysis fiber 136 (or other, possibly free-space optical path). This light to be analyzed is directed by the analysis fiber (or path) 136 into an optical analyzer 140, which performs various analyses on sample light emissions that are collected by the optical probe 120. A typical analysis that might be performed on light in backward path 226 (i.e. in analysis fiber 136) is to detect the power of light in one or more wavelength bands. For example, if light from the laser system 232 is used for heating an area of sample 210, light in backward path 226 collected by optics 124 might be analyzed to calculate the temperature of sample 210 in the heated area. One method for optical temperature measurement using embodiments of the disclosed system is optical pyrometry, in which the amount or power of black body radiation emitted from sample 210 in a range of wavelengths is analyzed using the Stefan-Boltzmann law and well-known techniques to determine the temperature. Because the emissivity of the sample 210 may be poorly known, and may be a function of wavelength, pyrometry may make use of measurements of the radiation from the sample 210 at more than one wavelength or in more than one range of wavelengths in order to determine an accurate temperature. Other optical methods for temperature measurement using Raman spectroscopy will be described later.

Some types of analyses of emissions from the sample 210, including pyrometry, may require measurements at more than one wavelength. Thus, a wavelength separator 142 may be used in the optical analyzer 140 to separate incoming light in the analysis fiber 136 into more than one output optical wavelength channel Even if the optical power at only one wavelength is measured, the wavelength separator 142 may still be used to separate the analysis wavelength from the wavelength of the excitation light source 232, so as to prevent the excitation wavelength from affecting the measured signal. The wavelength separator 142 may contain one or more optical filters, such as interference filters and associated optics, or a spatially dispersive means such as a grating or prism monochromator. Separate wavelengths are directed to one or more output optical channels 144 and detected individually by optoelectronic detectors 146. The optoelectronic detectors 146 may be discrete, individually connected, detectors such as PIN photodiodes, photomultiplier tubes, or avalanche photodetectors, or arrayed detectors, such as a CCD, CMOS, or PIN photodetector array. Electronic outputs from the detectors 146 are conveyed through electrical connections 148 to an electronic processor 150. In the schematic representation of the optical analyzer 140 in FIG. 1, vertical dots between the top pair of optical channels 144, detectors 146, and electrical connections 148 imply a plurality of individual wavelength detectors 146.

The electronic processor 150 in FIG. 1 includes required power supplies, amplifiers, signal-to-noise ratio improvement electronics, such as lock-in or other techniques for operating detectors 146, and may incorporate ratio calculations or background removal to preprocess the signals, as is known in the art. A data interface 152 connects the system controller 160 to the processor 150 to allow the bidirectional communication of control signals as well as numerical measurement data. Final calculations to determine sample temperature may be performed in the processor 150, or in the system controller 160. Thus, some or all of the functions of processor 150 may be performed in system controller 160. The system controller 160, or custom hardware, may be used as part of a feedback system used to control the power of the laser system 232 in order to achieve or maintain a constant desired temperature at sample 210, based on temperature readings obtained from optical analyzer 140. In some embodiments, such a feedback system may be used to implement a temporal heating and cooling profile, with sample 210 temperature changing at programmed or predetermined rates and durations.

Figure 2:
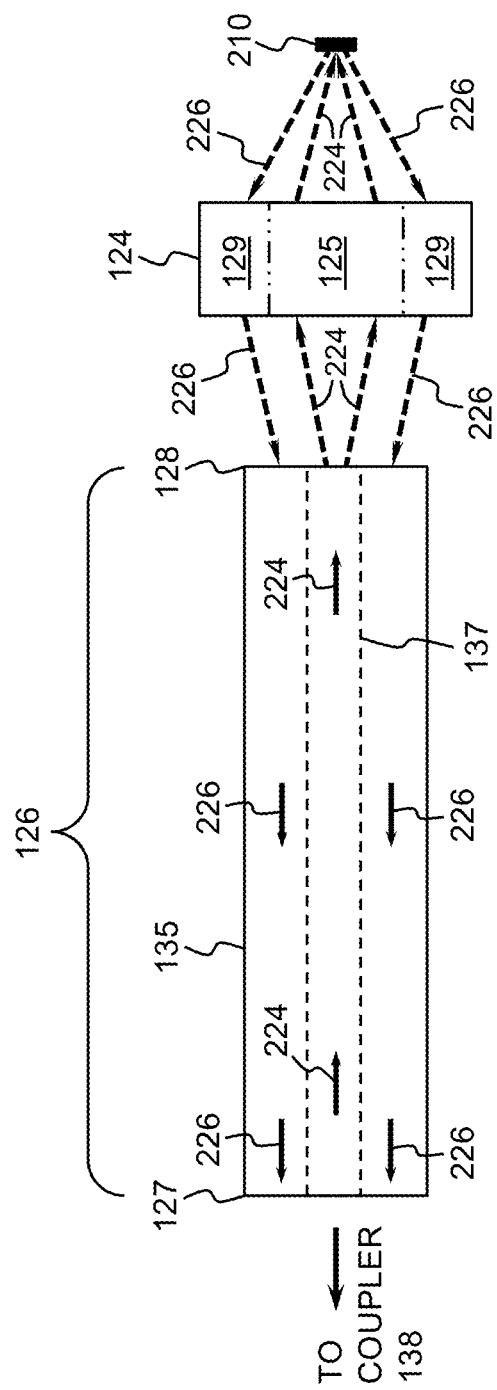
FIG. 2 is a schematic block diagram of a coaxial bidirectional light guide and associated optics according to an embodiment.

FIG. 2 shows a schematic block diagram illustrating a more detailed description of the operation of the bidirectional light guide 126 and the associated optics 124, and their interaction with a sample 210. The light guide 126 comprises an inner light guide 137 and an outer light guide 135 surrounding and coaxial with inner light guide 137. In the embodiment shown, the inner light guide 137 transmits forward light 224 from proximal end 127 of light guide 126 toward sample 210, and the outer light guide 135 transmits backward light 226 from the sample 210 in the reverse direction of forward light 224, from the distal end 128 toward the directional coupler 138. The surface of the sample 210 is shown for clarity in FIG. 2 oriented perpendicular to the axes of the light guide 126 and the optics 124, but as will be seen in the other figures, it may be oriented at different angles according to the needs of the application.

The optics 124 couple light in both the forward and backward directions between the distal end 128 of the light guide 126 and the sample 210. In particular, in one exemplary embodiment, the optics 124 are configured to couple or focus light from the inner light guide 137 onto the surface of the sample 210, and to couple light collected from the sample 210 back into the outer light guide 135, as described earlier in reference to FIG. 1. The optics 124 may be of a refracting type (dioptric), a reflecting type (catoptric), or some combination of the two (catadioptric). The optics 124 may comprise a single optical system in which forward light 224 and backward light 226 share a single optical aperture used both in focusing forward light 224 and collecting backward light 226. Alternatively, the optics 124 may be optionally divided into one or more inner portions 125 configured or optimized for coupling or focusing forward light 224 from the inner light guide 137 onto the sample 210; and one or more outer portions 129 configured or optimized for coupling backward light 226 from sample 210 into the outer light guide 135, as schematically shown in FIG. 2. Dividing the optics 124 into an inner portion 125 and an outer portion 129 allows these portions to be separately designed and optimized for their different functions. In some alternative embodiments, the outer light guide 135 and the associated optics 129 may be used to carry light toward the sample 210, and the inner light guide 137 and its associated optics 125 used to carry light away from sample 210.

Figure 3:
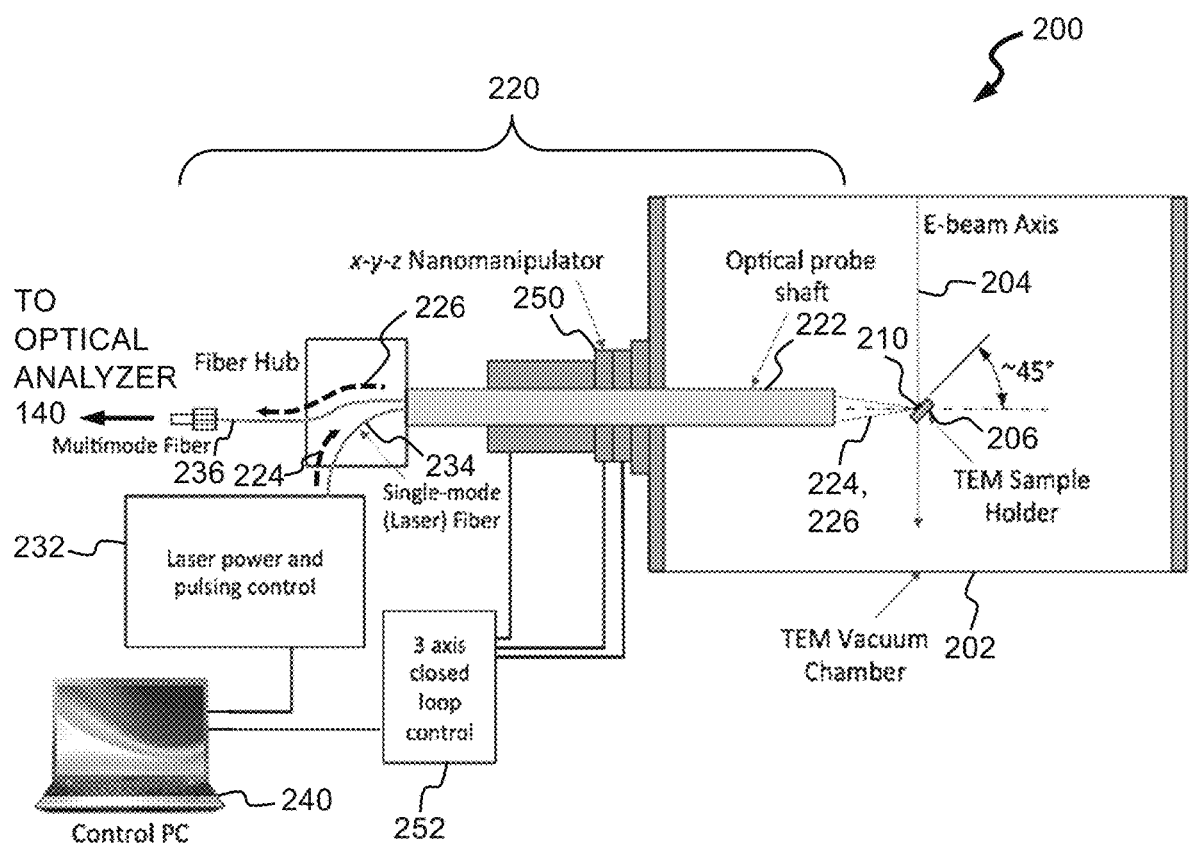
FIG. 3 is a schematic diagram depicting an embodiment of a system for use in a transmission electron microscope.

FIG. 3 shows in schematic form a system 200 according to the present disclosure for use in a transmission electron microscope (TEM). The figure shows an optical probe 220 for a TEM integrated into the sample holder portion 202 of a TEM column (a portion of the TEM vacuum chamber). The optical probe 220 in this application may be mounted to a different port from the TEM sample holder in order to allow the TEM sample holder to rotate about its axis in order to tilt the sample generally toward the optical probe 220. The sample 210 is mounted on a grid (not shown) held in the TEM sample holder 206, a portion of which is indicated in FIG. 3 by the small rectangle tilted at 45 degrees and supporting the sample 210. The sample is tilted at approximately 45 degrees (a compromise, which may be adjusted as required) to allow simultaneous illumination and observation of the sample 210 by an electron beam 204 and forward and backward optical beams 224 and 226, respectively. The optical probe shaft 222 contains the optics and mechanics required to direct light from an optical fiber (not shown) within shaft 222 through focusing optics (also not shown) to and from sample 210.

The optical probe shaft 222 is supported in a port to the TEM vacuum chamber with an optional x-y-z nanomanipulator 250, which is an optionally-motorized vacuum-sealed positioner allowing the optical beam to be moved with respect to the sample 210 in order to optimally position it, that is, so that the optical beam focal spot may be positioned to be approximately coincident or overlapping with an area being scanned by the electron beam 204. In some embodiments, the nanomanipulator 250 is motorized and can be positioned using motor controllers 252 under the command of a controller 240 such as a computer. A software program in the controller 240 to control the nanomanipulator 250, can be used to store the settings for different focal spot positions so that they can be recalled and returned to easily.

Parameters likewise may be set, stored, and recalled by controller 240 to control a light source such as laser system 232. As in FIG. 1, forward light 224 can be supplied by a laser system 232 through a single-mode laser fiber 234 to the optical probe 220, and backward light 226 can be extracted through an analysis fiber 236 (typically multimode). A directional coupler 138 to separate backward-propagating light 226 from forward-propagating light 224 is not shown in FIG. 3, but in some embodiments, such a directional coupler 138 may be housed within the optical probe 220. The laser system 232 in FIG. 3 contains a light source or laser as well as any required power supplies, pulse generators, and control electronics required for communication with the controller 240. The analysis fiber 236 is connected to an optical analyzer 140 (not shown) as described before.

Figure 4A:
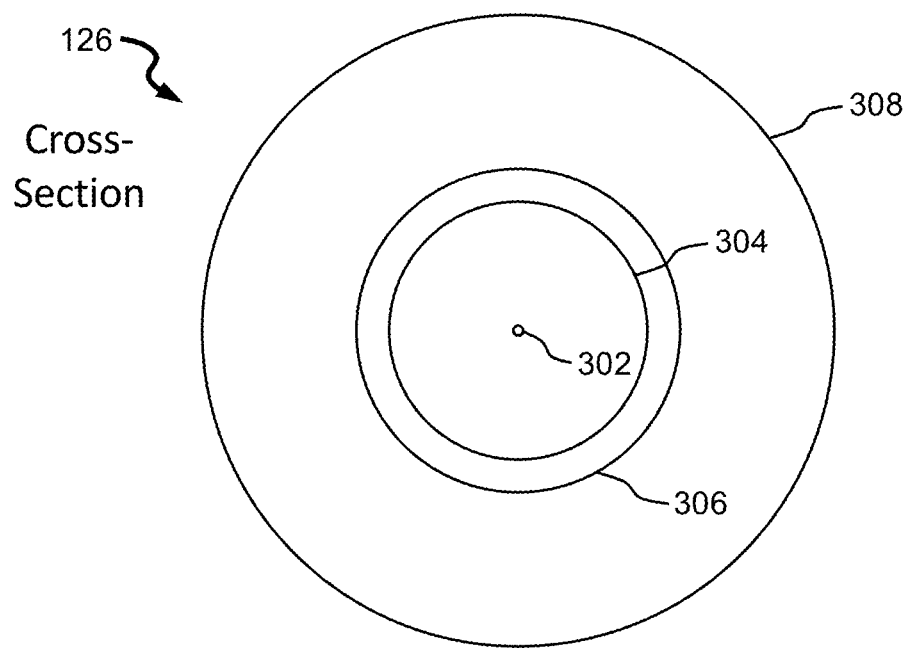
FIG. 4A shows a schematic cross-section of a double-clad optical fiber (DCF) light guide used in one embodiment.

FIG. 4A shows a cross-section of a light guide 126 in greater detail, illustrating the coaxial construction of one embodiment of the light guide 126 as a single optical fiber. The fiber illustrated is called a "double-clad fiber" or DCF. DCF is commonly used in connecting optical-fiber amplifiers and fiber lasers with their pump sources, and is starting to be used in certain endoscopy and optical coherence tomography applications. Conventional optical waveguide fibers have a single core surrounded by a lower refractive index optical cladding to confine light to the core region by total internal reflection. A DCF has a core, an inner cladding surrounding the core having a lower refractive index than the core, and an outer cladding of even lower refractive index to confine light to the inner cladding by total internal reflection. Thus, the inner cladding is capable of serving as a second, larger, and typically multimode, outer core. DCF is most commonly made all of silica glass, and for highest optical power handling, it is preferred that the core be pure silica (rather than having a raised index through e.g. germanium doping), and the cladding layers may be glass doped with fluorine in order to lower their refractive index. Alternatively, layers having even lower refractive index than silica are available by using certain polymers. Less commonly, lower effective refractive index structures can also be synthesized by incorporating carefully-engineered voids in the fiber, such fibers being known variously as "holey fibers" or in some configurations as "photonic crystal fibers" or "Kagome fibers."

In FIG. 4A, a typical fiber design (roughly to scale) that may be of use in the present system is shown. The core 302 is a few micrometers (m) in diameter, and the index difference between the core 302 and the inner cladding 304 may be chosen such that the core 302 guides laser light in a single transverse mode with a mode field diameter that may be a bit larger than the physical diameter of core 302, but still only a few micrometers in diameter. A typical numerical aperture (NA) for a single-mode core is between 0.12 and 0.19. The inner cladding 304 may be on the order tens of μm up to 100 μm in diameter (or up to a few hundred μm for collection over a greater area). The outer cladding 306 is typically also of glass, but may be a hard low-index polymer, and may typically be 10 μm or so thick. A larger refractive index step between inner cladding 304 and outer cladding 304 (to even lower index) may be used to increase the NA of the inner cladding to 0.24 to 0.30, or even greater, in order to collect, trap, and guide light over a greater range of angles in the inner cladding. A protective buffer 308 is applied during the drawing process to keep water and hydroxyl radicals out of the glass, which can weaken it; it is typically a dual-layer acrylate polymer having a low modulus for mechanical protection, and in standard-sized fibers (as shown in the figure, for the outer cladding, about 125 μm) the outer diameter of the buffer 308 is typically 245 μm. A complete light guide 126 as shown in FIG. 1 may have additional surrounding protective structures (not shown here) such as tensile strength members, an outer polymer tubing jacket, and armored flexible metal tubing for crush resistance.

Figure 4B:
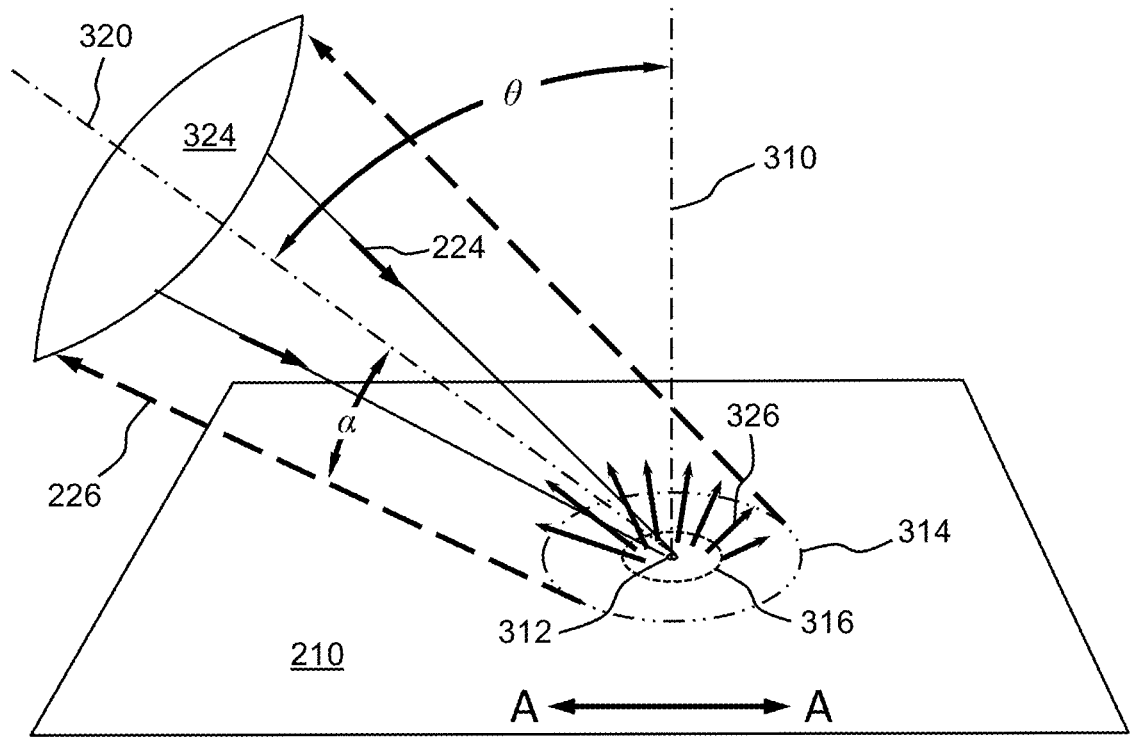
FIG. 4B is a perspective view of optical beam geometries at a sample surface during operation of an embodiment.

Optical beam geometries as they interact with the sample surface, resulting from using the DCF just described, in combination with the focusing optics 124, are shown schematically in a perspective view in FIG. 4B. A planar sample 210 is assumed for this discussion. The focusing optics 124 are represented symbolically in FIG. 4B by a lens 324. These focusing optics 324 may comprise a single lens 324 as shown, a lens system consisting of multiple elements, or a reflective optical system, as will be described later. By using a coaxial light guide 126 such as the DCF shown in FIG. 4A with this type of optical system, an irradiated spot 312, a heated spot 316, and a collection spot 314 on the surface of the sample 210 will automatically be substantially concentric with one another. The example geometry shown corresponds to an embodiment in which the DCF core 302 is use to transmit a heating beam in the forward direction toward the sample 210, and the inner cladding 304 is used to transmit light collected from sample 210 in the backward direction. The optical axis of the incident forward beam 224 and the collected backward beam 226 is indicated by an optical axis centerline 320, which in general may be tilted from the normal 310 to the surface of sample 210 by an angle θ as shown. This tilt θ tends to elongate what would be the circular spots 312, 314, and 316 along the plane of the tilt, i.e., along the direction indicated by arrows A-A, by a factor $1/\cos(\theta)$. Thus, for circular light guide geometries as shown in FIG. 4A, the indicated spots 312, 314, and 316 are actually elliptical in shape on a flat planar sample surface 210 that is tilted with respect to the optical axis 320. An irradiation spot 312 is the approximate extent of a focused spot caused by imaging a single-mode fiber core 302 onto the surface of the sample 210 through the focusing optics 324. The light is incident in a forward cone 224 having a cone angle determined by the mode field diameter and divergence angle of light emerging from the single-mode core 302, as well as details of the focusing optics 324.

A single-mode laser spot is approximately Gaussian in radial irradiance profile, so it does not have a hard edge; rather, this spot should be considered to be drawn schematically at a cutoff value of irradiance such as the commonly used $1/e^2$ threshold. In microscopy, and especially TEM, it is desirable to make the irradiated area as small as possible, which may be just a few micrometers across, and a typical magnification of the focusing optics 324 may be close to unity. The collection spot 314 represents a viewed area given by the extent of the area corresponding to an image of the inner cladding 304 formed on the sample 210 by the focusing optics 324. This is the area over which light emitted by the sample 210 can be gathered into the fiber inner cladding 304 via the backward cone 226 having half-angle α, as determined both by the aperture of optics 324 and the NA of the inner cladding 304. The width of the viewed area of the collection spot 314 is larger than that of the irradiated area of the core 302 by the ratio of the respective diameters of the inner cladding 304 and the core 302. The NA of the fully apertured or vignetted backward cone is given by NA=sin(a). This determines collection efficiency for the backward light 226 from the sample 210.

In the case of laser heating of the sample 210, the sample 210 will be significantly heated, i.e., heated to a measurable degree by pyrometry, over a "heat affected zone" (HAZ) 316 indicated by the ellipse 316. For a typical unity magnification of the focusing optics 324, and with a sample 210 of moderately high thermal conductivity, the HAZ 316 may be smaller than the viewed area of the collection spot 314, but larger than the irradiated area 312. Light rays 326 indicate that thermal optical radiation from the HAZ 316 may emanate from any point within the HAZ 316, and this emission is Lambertian, that is, emitted at all angles relative to the surface normal 310. Only those emitted rays 326 that are directed into the backward cone 226, i.e., those that are within the NA of the collecting optics and fiber, will be collected into light guide 126 for transmission back to the optical analyzer 140. This collection criterion is true for thermal radiation as well as for any sample luminescence stimulated by either the forward excitation beam 224 or cathodoluminescence from an electron beam, or any other process of sample emission or light scattering.

Figure 5A:
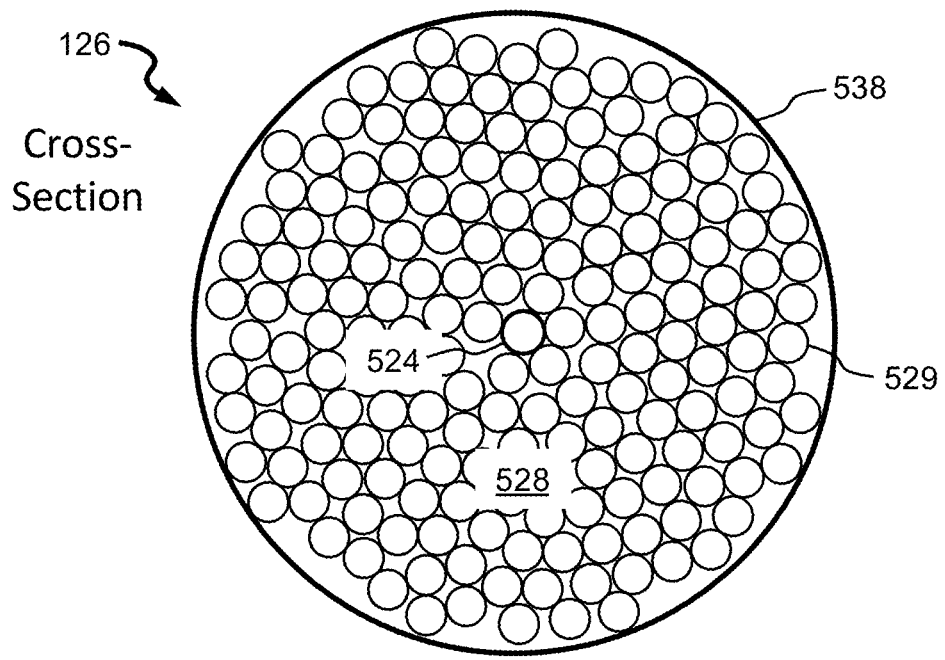
FIGS. 5A and 5B are schematic cross-sections of two types of fiber bundle light guides according to other embodiments.
Figure 5B:
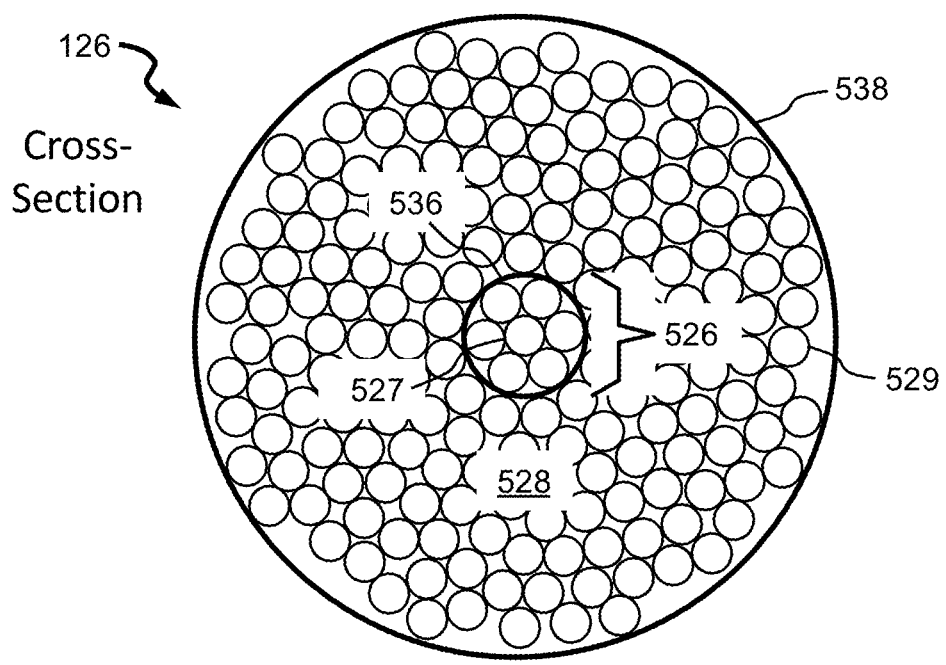

Alternatives for the construction of the light guide 126 are shown in FIGS. 5A and 5B, which show schematic cross-sections of two types of approximately circular fiber bundles. In both FIGS. 5A and 5B, individual optical fibers 529 are represented as small circles. Although each optical fiber 529 will typically contain separate core and cladding layers (and perhaps further protective buffer layers), this level of detail is not shown. In fact, any of these individual optical fibers 529 may further comprise a multilayer structure as described, a photonic crystal fiber structure, or a hollow core possibly with reflective coating layer or layers lining the bore.

In FIG. 5A, a bidirectional light guide 126 is depicted that comprises a single central inner fiber 524 surrounded by a bundle 528 of several (or many) individual outer optical fibers 529. The inner optical fiber 524 serves as an inner light guide 137, and the bundle 528 serves as an outer light guide 135. Constructing the light guide 126 out of a bundle or bundles makes it possible to independently optimize the inner light guide 137 and the outer light guide 135 for their tasks, e.g. in wavelength transmission, NA, etc. In particular, the individual fibers 529 in the outer bundle can be optimized for their light-gathering ability separately from the inner fiber 524, which can for example be a single-mode fiber to guide laser light of the highest mode quality for focusing onto the smallest spot on sample 210.

Individual outer optical fibers 529 can, for example, have a thin cladding and large numerical aperture in order to increase both packing fraction and the optical acceptance angle for optimal input coupling of the backward light 226 from the sample 210. A jacket 538 can be used to hold the bundle 528 together and protect it; the jacket 538 is typically flexible, e.g. polymer tubing, but making it rigid, e.g. out of steel hypodermic tubing, may make it convenient to support and align it, at least for a distal portion housed in a probe shaft 122 or 222. Other optional additional cable components including tensile stress members (such as Kevlar fibers), additional protective tubing and jacket layers, flexible or rigid armor tubing, etc., are not shown in either FIG. 5A or FIG. 5B.

In FIG. 5B, a cross-section of another embodiment of a light guide 126 is shown in which the inner light guide 137 is configured as an inner bundle 526, and outer light guide 135 is again an outer bundle 528. Inner bundle 526 may be optionally surrounded by an inner jacket 536, and again there may be an outer jacket 538. When light guide 126 includes both an inner bundle 526 and an outer bundle 528, there is no need for the number of fibers to be the same, or for the individual inner fibers 527 and outer fibers 529 to be of the same size, type, or material. Again, the inner light guide 137 and outer light guide 135 can be independently optimized for their tasks using the required numbers, sizes, and types of inner fibers 527 and outer fibers 529.

Other shapes and configurations of individual fibers and fiber bundles in bidirectional light guide 126 are possible to optimize the light-collection efficiency and spectral-transmission properties, such as mixing different types of fibers within the bundle (e.g. within outer bundle 528, within inner bundle 526, or both), shaping the bundle in a ring or other shape, etc. Different light guide types and geometries may require different types of directional couplers 138 to efficiently couple light into and out of the inner light guide 137 and the outer light guide 135.

Figure 6A:
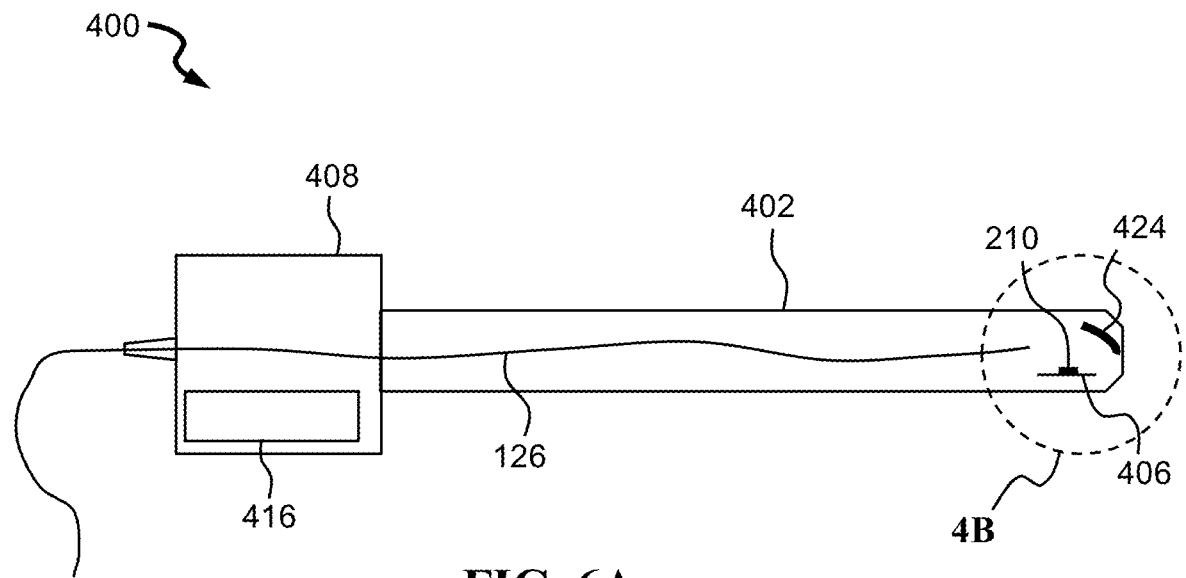
FIG. 6A is a schematic cross-section diagram of a TEM sample holder having an optical probe integrated therein according to another embodiment.
Figure 6B:
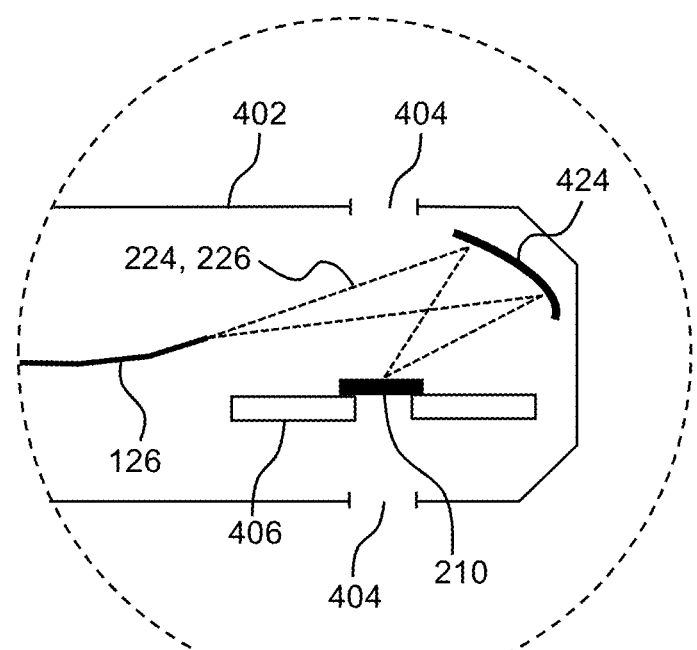
FIG. 6B is an enlarged view of a portion of FIG. 6A, showing details of the optical path in the region close to the sample.

An alternative embodiment of an optical probe for use in a TEM is shown in FIGS. 6A and 6B. Referring now to FIG. 6A, the functions of an optical probe including optical fiber and reflective optics are shown integrated into a TEM sample holder 400. A TEM sample holder 400 is a mechanism that enables mounting of a sample (typically on a ~3 mm diameter grid) in a removable hollow rod 402 that is vacuum sealed after insertion, and can be rotated to tilt the sample around the TEM sample holder 400 axis. Hollow rod 402 is the main body of the sample holder 400 and contains light guide 126, sample mount 406, sample 210, and optics 424. Sample mount 406 is a structure within sample holder 400 to which a sample 210 (typically further mounted to a grid, not shown) is affixed for observation. The sample mount 406 may be stationary within the sample holder 400 so that the sample 210 is tilted within the TEM by rotating the entire sample holder 400 around the axis of hollow rod 402, as described above; or, the sample mount 406 may have a mechanism enabling it to tilt or rotate within the sample holder 400 to facilitate observation of samples 210 at various different angles. A sample holder 400 typically also has an enlarged rear housing 408 to act as a handle and which may contain any actuators 416 for tilting the mount 406 within the sample holder 400, for further degrees of freedom.

A close-up of the region in the TEM sample holder 400 near the sample 210 is shown in FIG. 6B. Now inside the hollow rod 402, a sample 210 can be seen on the sample mount 406, and a focusing optic 424 is shown as a reflective optic directing light from the distal end of the light guide 126 to (224) and from (226) sample 210. The focusing optic 424 may optionally be an ellipsoidal mirror with one focus at the distal end of the light guide 126 and the other focus on the surface of the sample 210. Other mirror shapes may be useful in combination with, for example, additional refractive optics, and different arrangements of the fiber end, the mirror shown as optic 424, and sample 210 may result in superior performance or a more compact design. In FIG. 6B, the focusing optic 424 is shown located so as not to block either of the apertures 404, so as to stay out of the path of an electron beam (not shown), which enters and exits the sample holder 400 through the apertures 404. Alternatively, the focusing optic 424 can have a hole or aperture in it large enough to pass an electron beam. Thus, we see that either refractive or reflective optics, or a combination of both, may be used in different embodiments of the present system, and the optical probe may be either separate from, or integrated with a sample holder 400 for use in different microscopes.

Figure 7:
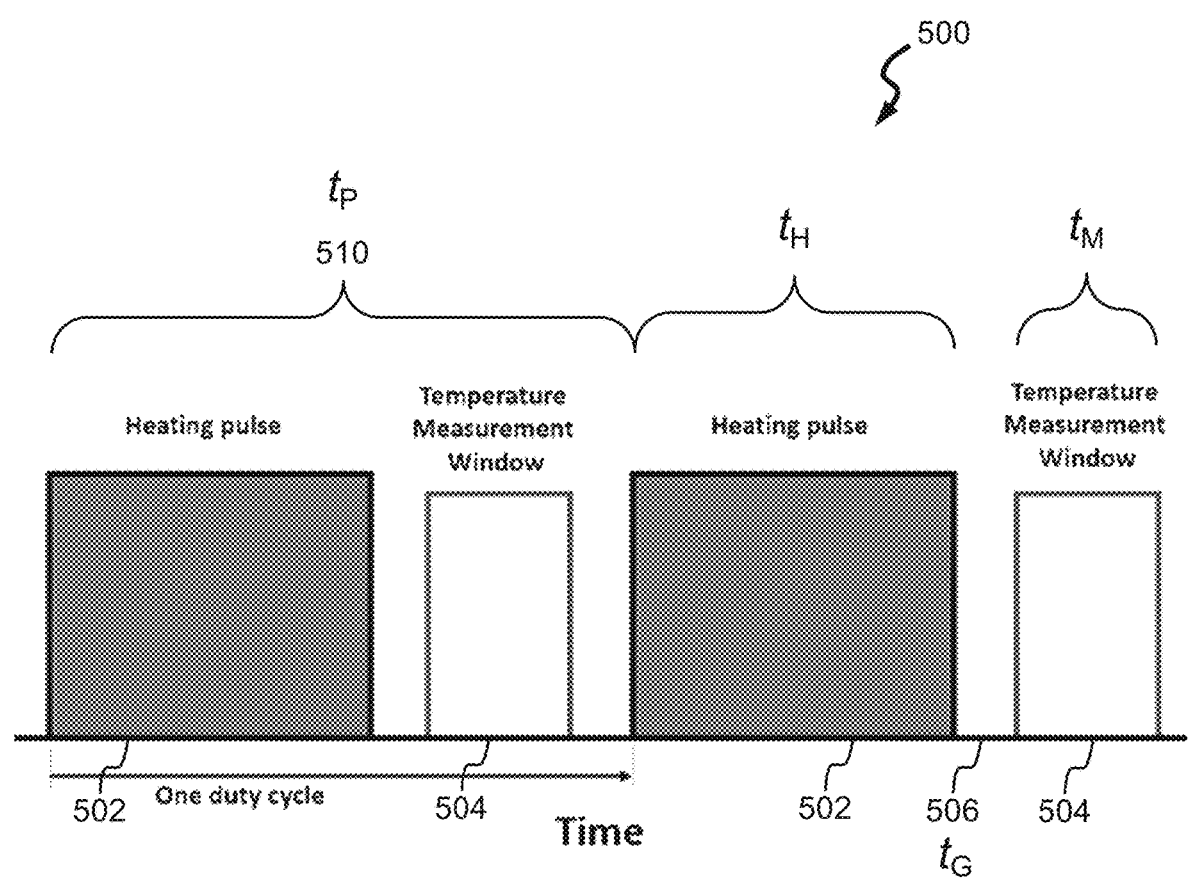
FIG. 7 is a waveform showing an example of a pulsing program for a heating laser, and for detection of the IR radiation from the heated sample during the "off" portion of the laser duty cycle.

In some situations, when attempting to perform pyrometry with a weak infrared thermal radiation signal or Raman thermometry (to be described later) using a weak Raman scattered signal, there may be insufficient rejection in the wavelength separator 142 to avoid having some scattered light from the forward laser heating beam 224 interfere with the detection of the weak analysis signal by its scattering into backward path 226. In these cases, a pulsing program 500 as illustrated in FIG. 7 may be used, assuming that it can be a rapid enough cycle to avoid too much temperature decay due to sample cooling while the laser is off. In this scheme, the laser can be pulsed, possibly repetitively as shown, with a duty cycle 510 having period $t_p$, and with a heating pulse 502 lasting for heating time $t_H$. While the laser is off so as not to interfere with the measurement, temperature measurement can occur in time segment 504 of length $t_M$. For Raman thermometry, a separate excitation laser may be turned on during the measurement time segment 504. There may be some unavoidable gaps 506 having length $t_G$ either before (as shown) or after the temperature measurement, but it is likely best to minimize these to allow maximum time for heating and measurement.

Figure 8:
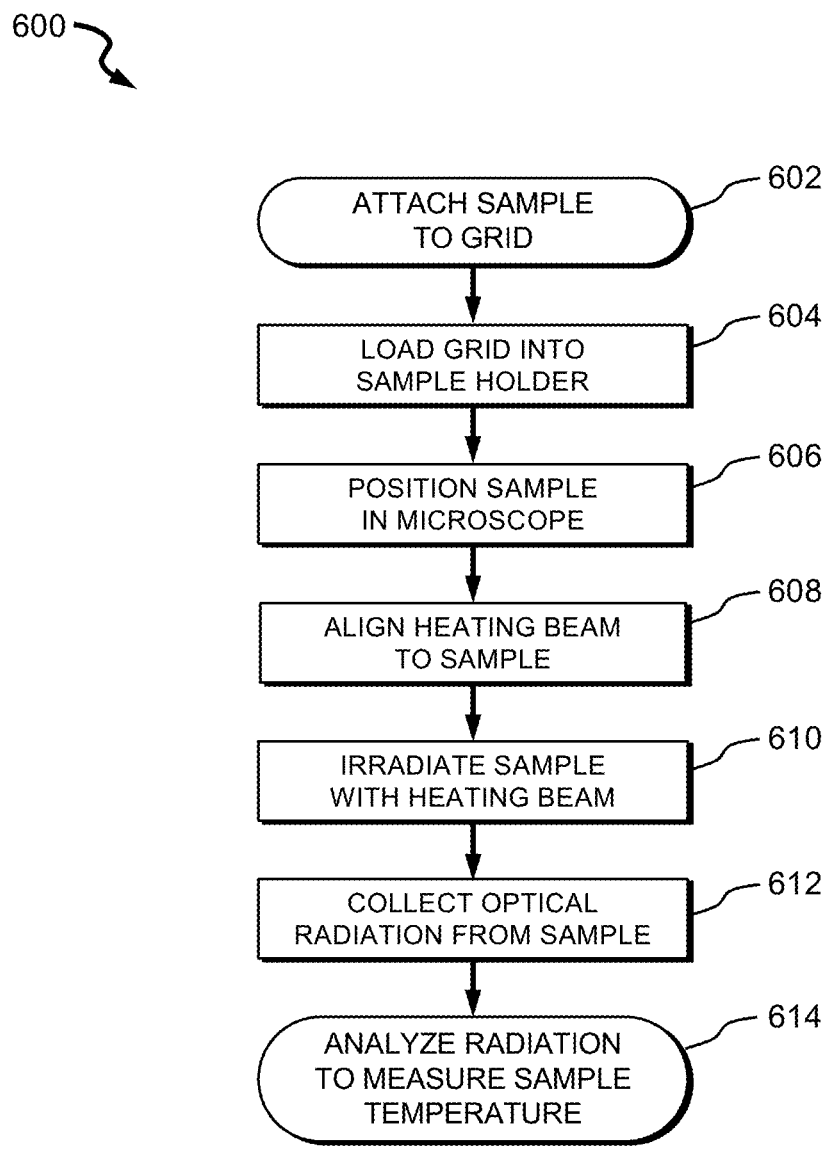
FIG. 8 is a flow chart depicting a method for heating a sample in a microscope and measuring the temperature thereof using a system.

FIG. 8 is a flowchart illustrating a method 600 for heating a sample 210 in a microscope and observing it, while measuring the temperature thereof, using an embodiment of the present system. In step 602, a sample is attached to a grid for handling. The grid with a sample 210 on it is loaded into a microscope sample holder in step 604. (Step 604 is somewhat particular to TEM; for optical microscopes, there may be a slide instead of a grid, and no additional sample holder to mount onto the microscope stage.) In step 606, the sample 210 is positioned within the microscope so that the portion of the sample 210 that is of interest is in the observation field of view. The heating beam is aligned to heat the same area of the sample 210 that is being observed in step 608. The alignment process may be performed at a lower optical power to avoid affecting the area of interest on the sample 210 prematurely; or it may be performed at a known location away from the area of interest. If the optical probe is prealigned to be coincident with the observation point, then it may not be necessary to perform alignment step 608 for every sample; it may have taken place before attaching the sample 210 to a grid, or it may be considered to be part of step 606 or coincident in time with step 606.

Next, the heating beam is turned on to irradiate and treat the sample 210 at a known power level and pulse length in step 610. Due to the coaxial or concentric optics using a coaxial light guide, step 612, collecting optical radiation, can be done at the same time as irradiation, or, alternatively, a pulsed (time multiplexed) heating and measurement scheme like that in FIG. 7 can be used. In the case in which Raman thermometry is used, an excitation laser may irradiate the sample during step 612. Finally, in step 614, the optical radiation is analyzed to measure sample temperature. Step 614, depending on the hardware and software capabilities, may be performed in real time during the heating and measurement operations, or may be done after irradiation is ended. As mentioned in reference to system controller 160, the sample temperature measured in step 614 may be used in part of a feedback control function to adjust the heating beam power.

In summary, practicing the system and method according to this disclosure provides a way of simultaneously irradiating and collecting light in spatially coincident and approximately concentric areas on a sample using a single compact optical probe, i.e. without requiring multiple independently-aligned and potentially vacuum- or atmosphere-sealed optical systems.

Alternative Applications

It will be apparent to those skilled in the art that the system and method disclosed has applications outside charged-particle beam microscopes, and that it can be used in any situation where simultaneous laser heating, or other optical excitation or irradiation, and the collection of optical radiation from a coincident area on a sample or surface is required. A bidirectional light guide 126 can be used to transmit laser light at different wavelengths for purposes other than heating, such as for transmitting excitation light for stimulating sample fluorescence or photoluminescence, or nonlinear scattering (e.g. Raman scattering) and for gathering the fluorescence or scattered wavelengths to perform various analyses and spectroscopies.

Collected optical radiation is not limited to infrared wavelengths for temperature measurement, but can be at any wavelength of interest emitted or scattered by a sample stimulated by photothermal laser heating as described above, or by optical excitation using the laser photon energy. As an example, photoluminescence spectra can be acquired by using a short-wavelength excitation laser source and a monochromator as a wavelength separator 142 as shown in FIG. 1.

Reversing Inner and Outer Light Guide Directions

In some cases, it may be preferable to heat or excite a large area, and collect a temperature measurement from a small area within the larger heated area. In this case, the outer light guide 135 can be used to transmit forward light 224, and the inner light guide 137 can be used to transmit backward light 226, as mentioned briefly before in the discussion of FIG. 2. The direction of the arrows and identification by reference numerals 224 and 226 would thus be interchanged in both FIGS. 2 and 4B. In the case of application to small samples inside electron microscopes, a smaller heated area is usually required, and to reach high temperatures, a high irradiance (power per unit area) is needed, facilitated by a smaller focused laser spot. But for larger objects to be heated, a high-power laser beam can be conducted in a multimode fiber or bundle used as the outer light guide 135, while temperature measurements can be taken using the inner light guide 137. The advantage of this configuration is that since the collection area is smaller than the heated area, the temperature may be more uniform across the collection area, and a more accurate temperature of the heated area may be measured as a result. Inaccuracies due to the difference of the collection area and the heated area are known in pyrometry as the "size-of-source effect."

Use of Both Inner and Outer Light Guides in the Forward Direction

In fact, a system 100 using the coaxial light guide 126 and the optics 124 installed in a microscope 102 may be configured to use the inner light guide 137 and the outer light guide 135 in different ways as an optical delivery or light gathering device. In the case that the light guide 126 is a double-clad fiber, if desired, either or both of the core 302 or the inner cladding 304 of the light guide 126 may be used to send light for optical excitation of a sample 210. For example, excitation light may be delivered alternatively through the inner cladding 304 to a sample 210 instead of through the core 302, by launching a light source such as a laser or broadband light source into the multimode inner cladding 304 instead of the core 302. Alternatively, two different types or wavelengths of excitation light (e.g. a laser and a broadband source) can be launched in the direction 224 toward the sample 210 in the core 302 and the inner cladding 304 simultaneously, so as to overlap the same area as shown in FIG. 4B on the surface of the sample 210. Examples of experiments that can make use of optical excitation in a transmission electron microscope are versions of electron energy loss spectroscopy (EELS) that add optical excitation at a known photon energy to perform stimulated electron energy loss (SEEL), or electron energy gain spectroscopy (EEGS).

Use of Backward Path 226

Similarly, a system 100 according the present disclosure may be used without a laser system 232 or other forwardly-directed optical excitation in direction 224, but instead used to gather backwardly emitted light 226 from a sample 210. An example of an analysis technique in an electron microscope (TEM or SEM) that can be performed using optics 124 and light guide 126 is cathodoluminescence, in which the sample is excited not by an optical beam but by an electron or ion beam. Optimizing the focusing optics 124 and the light guide 126 optical properties, and in particular, the diameter and numerical aperture of the inner cladding 304, to achieve maximum light-gathering efficiency for pyrometry also makes the backward path 226 in system 100 useful for analyzing cathodoluminescent light; the optical analyzer 140 can be used to perform cathodoluminescence spectroscopy for materials analysis.

Raman Thermometry

Another example of an in situ observation using a system and methods according to embodiments of the present system and method that can be performed within a charged-particle beam microscope, and making use of both forward optical paths 224 and backward optical paths 226, is to perform Raman spectroscopy on a sample in the microscope. Raman spectroscopy relies on inelastic scattering, or Raman scattering, of the monochromatic light from the laser. The laser light interacts with molecular vibrations, phonons or other excitations in the system, resulting in the energy of the laser photons being shifted down or up. The shift in energy gives information about the vibrational modes in the system. Raman spectra, which are sensitive to material structure, can reveal useful information, such as chemical composition, defect density, structure chirality, temperature, stress or strain, and magnetization of nanomaterials. Since the intensity of Raman scattered light, and its wavelength shifts from the excitation wavelength, can be relatively small, narrow-linewidth excitation lasers and good sharp-edged filters or monochromators are useful to reject the excitation light while detecting the scattered light. Raman spectroscopy has been performed inside a TEM by others using different optical systems from those of the present invention Raman spectroscopy for temperature measurements.

Perhaps less well-known is the fact that one can use Raman spectroscopy to determine the temperature of a material being analyzed. [See, for example, David Tuschel, "Raman Thermometry," Spectroscopy magazine, December 2016, pp. 8-13.] If a Raman band is sufficiently narrow, the peak position can be seen to shift with temperature. Another way of determining the temperature is to measure the ratio of intensities of up-shifted (anti-Stokes) Raman peaks and down-shifted (Stokes peaks) and calculate the temperature based on a Boltzmann distribution of the ground and first excited state populations.

Raman spectroscopy can thus be used as an alternative to pyrometry for a non-contact thermometry tool, due to the temperature dependence of Raman peak intensities or positions. If the Raman spectrum of a particular sample material is difficult to use for measuring temperature directly using light scattered from the sample, then temperature measurement of arbitrary samples can alternatively be performed by measuring auxiliary silicon nanoparticles that have been deposited onto the sample (or nearby within the heat-affected zone of the heating laser beam and within the collection area of the optical system 124 and the outer light guide 135). The position of the silicon Raman peak wavelength shows a strong and linear temperature dependence; therefore, collecting the Raman-scattered light from the silicon in contact with the sample can be exploited to measure the temperature of the sample.

In the use of Raman spectroscopy for temperature measurement, separate optical beams may be used for sample heating and Raman excitation. A single laser could be used for both heating and Raman excitation, but it may be preferable to provide multiple sources at separate wavelengths with independent control over their power levels and perhaps focal spot sizes. Since different optical excitation wavelengths and powers may be used for sample heating compared to Raman excitation, it may be desirable to multiplex the two or more types of excitation light being conducted in the forward direction toward the sample, e.g. in the inner light guide 137. Such multiplexing may be performed spatially, for example by using two separate fibers in an inner bundle 526, as shown in FIG. 5B, for both heating and Raman excitation. Or the Raman excitation could be applied using the same outer light guide 135 that collects backward-propagating Raman scattered light. Alternatively, heating and excitation light may use a single fiber in the inner light guide 137, coupling both types of light into the single fiber (or core in DCF) using an optical technique such as wavelength or polarization multiplexing. To accomplish this, multiple laser sources 232 could be combined using an optical multiplexer (not shown) into forward fiber 134 and coupled into laser port 139 of directional coupler 138 as shown in FIG. 1. Whether using a single inner light guide fiber with optical multiplexing, or spatial multiplexing using separate fibers, a temporally multiplexed pulsing program 500 as shown in FIG. 7 can also be used in addition, to avoid interference of heating light with temperature measurement light.

None of the description in this application should be read as implying that any particular element, step, or function is an essential element which must be included in the claim scope; the scope of patented subject matter is defined only by the allowed claims. Moreover, none of these claims are intended to invoke 35 U.S.C. Section 112(f) unless the exact words "means for" are used, followed by a gerund. The claims as filed are intended to be as comprehensive as possible, and no subject matter is intentionally relinquished, dedicated, or abandoned.

We claim:

1. A pyrometer for use in a charged-particle beam microscope, the pyrometer comprising:
   a bidirectional light guide having a proximal end and a distal end, the bidirectional light guide further comprising an inner light guide and an outer light guide, the outer light guide surrounding the inner light guide and coaxial therewith; wherein the bidirectional light guide comprises a double-clad optical fiber, the double-clad optical fiber further comprising a core, such that the inner light guide of the bidirectional light guide corresponds to the core of the double-clad fiber, and the outer light guide corresponds to the inner cladding of the double-clad fiber;
   a directional coupler having a laser port, an analyzer port, and a distal port, the distal port optically coupled to the proximal end of the bidirectional light guide, the directional coupler configured to direct a backward-propagating light emitted from a sample and entering the distal port to exit at the analyzer port, and to direct a forward-propagating light entering the laser port to exit at the distal port;
   a laser optically coupled to the laser port of the directional coupler to provide forward-propagating laser light;
   focusing optics optically coupled to the distal end of the light guide and configured to focus the forward-propagating laser light onto the sample;
   collection optics optically coupled to the distal end of the light guide and configured to collect backward-propagating light emitted from the sample; and
   an optical analyzer coupled to the analyzer port of the directional coupler; the optical analyzer configured to measure at least one parameter of the backward-propagating light, and further comprising a processor configured to calculate a temperature of the sample from the at least one measured parameter of the backward-propagating light;
   whereby the sample is heated by the forward-propagating laser light focused onto it by the focusing optics, and the temperature of the sample is calculated from the at least one measured parameter of the backward-propagating light.

2. The pyrometer of claim 1, wherein the forward-propagating light is transmitted in the inner light guide, and the backward-propagating light is transmitted in the outer light guide.

3. The pyrometer of claim 1, wherein the focusing optics and the collection optics share a single aperture.

4. The pyrometer of claim 1, wherein the focusing optics are coaxial with the collection optics.

5. The pyrometer of claim 1, wherein the at least one measured parameter comprises an optical power in at least one predetermined range of wavelengths, and the backward-propagating light comprises black body radiation emitted from the sample.

6. The pyrometer of claim 1, further comprising an excitation laser coupled to the laser port of the directional coupler, and wherein the backward-propagating light comprises Raman scattered radiation emitted from the sample.

7. A charged-particle beam microscope; the charged-particle beam microscope comprising:
   a pyrometer for use in the charged-particle beam microscope, the pyrometer further comprising
   a bidirectional light guide having a proximal end and a distal end, the bidirectional light guide further comprising an inner light guide and an outer light guide, the outer light guide surrounding the inner light guide and coaxial therewith; wherein the bidirectional light guide comprises a double-clad optical fiber, the double-clad optical fiber further comprising a core; so that the inner light guide of the bidirectional light guide corresponds to the core of the double-clad fiber, and the outer light guide corresponds to the inner cladding of the double-clad fiber;
   a directional coupler having a laser port, an analyzer port, and a distal port, the distal port optically coupled to the proximal end of the bidirectional light guide, the directional coupler configured to direct a backward-propagating light emitted from a sample and entering the distal port to exit at the analyzer port, and to direct a forward-propagating light entering the laser port to exit at the distal port,
   a laser optically coupled to the laser port of the directional coupler to provide forward-propagating laser light,
   focusing optics optically coupled to the distal end of the light guide and configured to focus the forward-propagating laser light onto the sample,
   collection optics optically coupled to the distal end of the light guide and configured to collect backward-propagating light emitted from the sample, and an optical analyzer coupled to the analyzer port of the directional coupler; the optical analyzer configured to measure at least one parameter of the backward-propagating light, and further comprising a processor configured to calculate a temperature of the sample from the at least one measured parameter of the backward-propagating light, whereby the sample is heated by the forward-propagating laser light focused onto it by the focusing optics, and the temperature of the sample is calculated from the at least one measured parameter of the backward-propagating light.

8. A method of measuring a temperature of a sample in a charged-particle beam microscope; the method comprising:

aligning a heating beam to a predetermined position on the sample;

irradiating the sample with the heating beam through a bidirectional light guide, where the bidirectional light guide comprises a double-clad fiber;

collecting optical radiation from the sample;

transmitting the collected optical radiation through the bidirectional light guide to an optical analyzer; and, analyzing the optical radiation to determine the temperature of the sample.

9. The method of claim 8, further comprising:

pulsing the heating beam off and on; and, collecting the optical radiation from the sample between the on pulses of the heating beam.

10. The method of claim 8, further comprising the step of adjusting the heating beam power in response to the temperature of the sample as determined by analyzing the optical radiation, whereby feedback control of the sample temperature can be accomplished.

* * * * *